United States Patent [19]

Beranger et al.

[11] 4,295,210
[45] Oct. 13, 1981

[54] POWER SUPPLY SYSTEM FOR MONOLITHIC CELLS

[75] Inventors: Hervé Beranger, Fontainebleau; Claude Marzin, Mennecy; Dominique M. Omet, Corbeil; Jean-Luc Peter, Ris-Orangis, all of France

[73] Assignee: International Business Machines Corporation, Armonk, N.Y.

[21] Appl. No.: 71,826

[22] Filed: Sep. 4, 1979

[30] Foreign Application Priority Data

Nov. 30, 1978 [FR] France ............................. 78 34434

[51] Int. Cl.³ .............................................. G11C 11/40
[52] U.S. Cl. ..................................... 365/227; 365/226
[58] Field of Search .............................. 365/227, 226

[56] References Cited

U.S. PATENT DOCUMENTS

| | | | |
|---|---|---|---|
| 3,423,737 | 1/1969 | Harper | 365/174 |
| 3,537,078 | 10/1970 | Pomeranz | 365/174 |
| 3,621,302 | 11/1971 | Pricer | 307/291 |
| 3,688,280 | 8/1972 | Ayling et al. | 365/227 |

Primary Examiner—Terrell W. Fears
Attorney, Agent, or Firm—Wesley DeBruin

[57] ABSTRACT

A power-supply system for use in a monolithic memory characterized in that the power dissipation of the memory is reduced. Each word line is connected to a current switch circuit comprised of a first transistor the collector of which is connected to a voltage V1, its base being connected to the output of the address decoder, a second transistor the collector of which is connected to a voltage V2. V3 being the second voltage impressed on the memory cells (where |V2| is larger in magnitude than |V1| and |V3| is larger in magnitude than |V2|). The emitters are connected to each other and to the corresponding word line. According to the state of the decoder output, the first or the second transistor is conducting, whereby the selected cells are subjected to a voltage having a magnitude of |V3-V1| and the non-selected cells are subjected to a voltage having a magnitude of |V3-V2|.

3 Claims, 3 Drawing Figures

POWER SUPPLY SYSTEM FOR MONOLITHIC CELLS

DESCRIPTION

1. Technical Field

This invention concerns random access writable type monolithic memories and, more particularly, a device for powering-up such memories, with which it is possible to greatly reduce the power dissipation.

The improvements made in the integrated circuit technology have been such that it is now possible to obtain very high circuit densities which are of the utmost interest in the implementation of memories. Indeed, it is now possible to manufacture random access memories having up to 10,000 memory cells and peripheral control and detect circuits, upon a chip. In such an environment, it is obvious that the problems relative to the power dissipation are very critical and, therefore, this dissipation must be reduced to a minimum.

This problem is well-known in the prior art, and various solutions have been proposed to solve it.

2. Background Art

French Pat. No. 69 41886 filed Dec. 4, 1969 and published on Oct. 9, 1970 under No. 2 028 333 discloses the reduction of the power dissipated within a memory wherein all the cells are integrated upon a single chip. (French Pat. No. 69.41866 corresponds to U.S. Pat. No. 3,621,302 entitled "Monolithic-Integrated Semiconductor Array Having Reduced Power Consumption" granted Nov. 6, 1971 to W. D. Pricer and of common assignee.) To this end, the memory is divided into several groups of cells. Each group is fed with a common supply voltage, through a resistor. Consequently, when none of the cells is selected, the supply current is low and held to a sufficient value so that the information is kept in memory. A transistor is connected in parallel with the resistor so that when a cell is selected, it shunts the resistor, whereby the cells in the selected group are supplied with a high current under a constant voltage so that the various operations, such as reading, writing, etc., can be accomplished.

Other types of low current feeds when the cells in a memory are not selected, are also disclosed in two articles published in the IBM Technical Disclosure Bulletin. The articles are: (1) "Memory Cell with Low-Standby Power" by S. K. Wiedmann, Vol. 14, No. 6, Nov. 1971, page 1720; and (2) "Random Access Memory Cell" by S. K. Wiedmann, Vol. 14, No. 6, Nov. 1971, pages 1721-2.

In those devices, the dissipated power is actually reduced but to the detriment of the features of the cells which are modified. Indeed, since the current in the non active cells is lower, the immunity to noise is decreased, and the switching rate as well.

SUMMARY OF THE INVENTION

Therefore, the main object of this invention is to reduce the power dissipated within a writable-type monolithic memory without modifying the features of the memory.

Another object of this invention is to reduce the power dissipated within a monolithic memory owing to simple means which take as little space as possible on the chip.

According to this invention, the power dissipated in a writable-type memory being comprised of cells made up of bistable circuits arranged into rows and columns, is obtained by feeding the selected cells with a higher voltage than that used to feed the deselected cells while holding the same standby current in the cells, either selected or not, so that the noise immunity and the switching rate are not adversely affected.

To this end, the word lines of the memory cells are power-supplied from current switching circuits. These circuits are comprised of two transistors having their emitters connected to each other, the common point being connected to a word line. The collector of the first transistor is connected to a first supply voltage V1 being of a first value, such as ground, and the collector of the second transistor is connected to a second supply voltage V2 being of a second value, where $|V1|<|V2|<|V3|$ and V3 is the other cell supply voltage of a third value, for example, $-4.25$ volts. The base of the first transistor is connected to the output of the decoder which controls the selection of the corresponding word line, and the base of the second transistor is connected to a reference voltage. In this way, when the word line is selected, the first transistor is turned ON, the second one being OFF, and the cells connected to this word line are subjected to a voltage having a magnitude of $V3-V1$. On the other hand, when the word line is deselected, the first transistor is turned OFF, the second one being ON, and the cells are subjected to a voltage having a magnitude of $V3-V2$. A change in the current in the cells is not associated with the change in the feeding voltage, since the cells can even be fed with a constant current by employing current sources.

BRIEF DESCRIPTION OF THE DRAWINGS

This invention will be further explained with reference to the accompanying drawings, in which.

DISCLOSURE OF THE INVENTION

Figure 1:
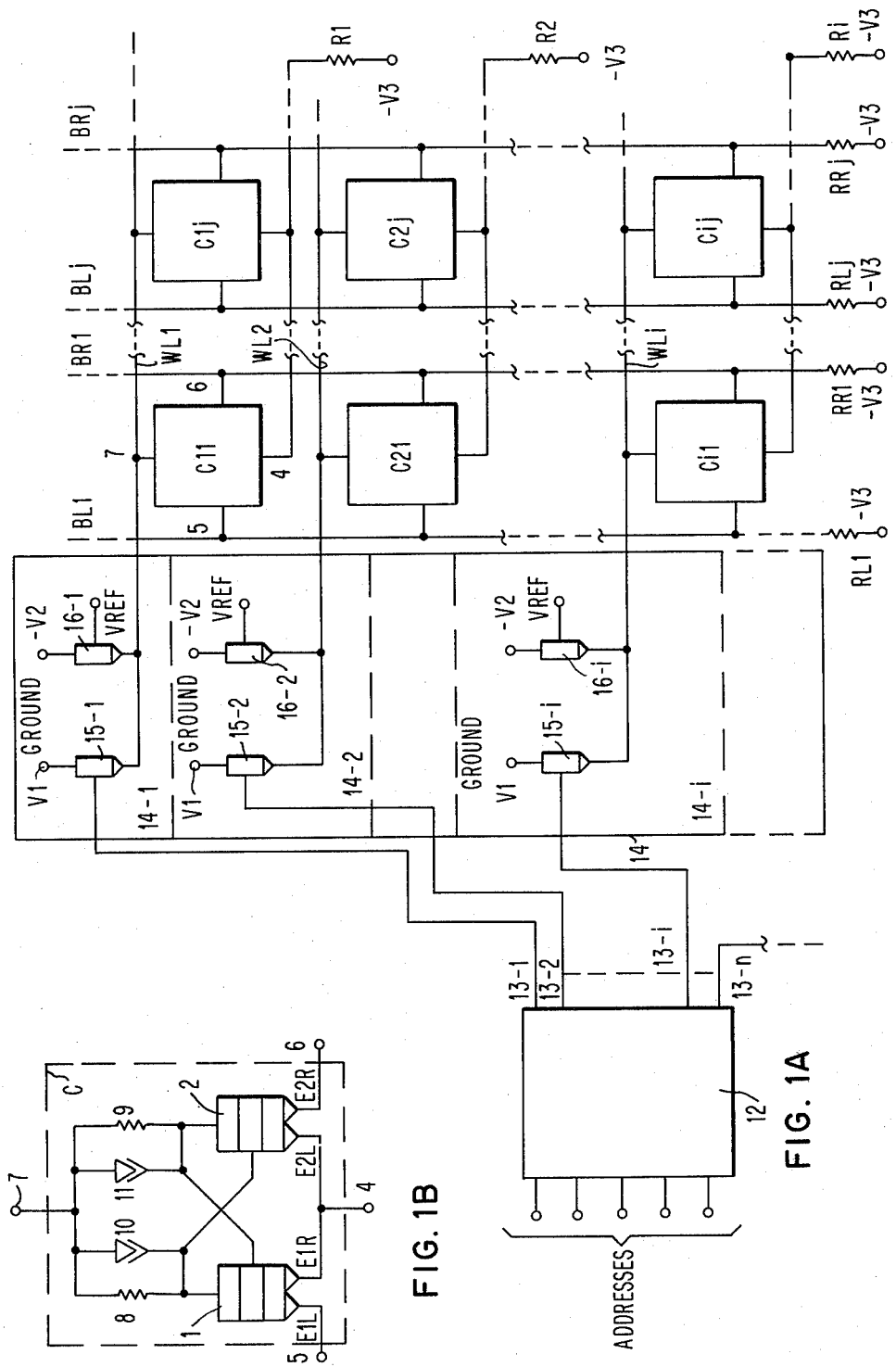
FIG. 1A illustrates the layout of an integrated monolithic memory together with the power supply system in accordance with the invention.
FIG. 1B is the schematic circuit diagram of a memory cell which may be employed in the memory of FIG. 1A.

The power-supply system, in accordance with the invention, is shown in FIG. 1A employed in a memory comprised of cells arranged into rows and columns. Different types of cells made up of bistable circuits can be used but the principle of this invention will be illustrated, by way of an example, with Harper-type cells. The Harper cells are well-known in the art, and reference can be made to U.S. Pat. No. 3,423,737 for a more detailed description thereof.

[U.S. Pat. No. 3,423,737 entitled "Non-Destructive Read Transistor Memory Cell" granted Jan. 21, 1969 to L. R. Harper and of common assignee herewith. Reference may also be made to U.S. Pat. No. 3,537,078 entitled "Memory Cell With A Non-Linear Collector Load" granted July 11, 1968 to J. N. Pomeranz and of common assignee herewith.

A Harper cell C, FIG. 1B, is comprised of two transistors, 1 and 2, having two emitters, both these transistors being cross-coupled, i.e., the collector of one transistor is connected to the base of the other. The emitters E1R and E2L of transistors 1 and 2 are connected together to terminal 4. The emitters E1L and E2R of transistors 1 and 2 are connected to terminals 5 and 6, respectively.

The collectors of transistors 1 and 2 are connected to terminal 7 through resistors 8 and 9, respectively. Two Schottky diodes 10 and 11 are respectively connected in parallel with resistors 8 and 9.

In a memory matrix having n rows and m columns, cells C are arranged into rows and columns, as schematically shown in FIG. 1A.

In FIG. 1A, six cells are shown, C11, C1j in the first row, C21, C2j in the second row, and Cil and Cij in the ith row. The terminals 4 through 7 of cell C11 has been shown in order to depict the manner in which the cells are connected in FIG. 1A.

All the terminals 4 of the cells in a row are connected to a common line. Each common line is connected, through a current sink schematically shown by resistor R1, R2, . . . , Ri, to a negative voltage $-V3$ which, in the preferred embodiment, is equal to $-4.25$ volts.

Likewise, the terminals 5 of the cells in a row are connected to common lines BL1, BLj, to a negative voltage $-V3$, through resistors RL1 and RLj, respectively. The same holds true for terminals 6 which are connected to common lines BR1 and BRj, respectively. The common lines BL and BR are bit lines positioned on the left and the right of the cells, respectively.

The terminals 7 of the cells in the different rows are respectively connected to common lines WL1, WL2 and WLi which are the word lines of the memory.

In such a memory, the binary information contained in each of the cells is represented by the states of transistors 1 and 2. By way of an example, in order to represent a binary "one," transistor 1 is ON (conducting) and transistor 2 is OFF (non-conducting) and to represent a binary "0," transistor 1 is OFF and transistor 2 is ON.

When a cell is to be selected in order to write information therein, i.e., to change the state of the cell or read information from the cell, the word line WL associated with the cell with be energized. For example, word line WLi, when cell Cij is selected. The information is read from, or written into the cell through read-write circuitry not shown, and the bit lines. For example, bit lines BLj and BRj, when cell Cij is selected. Read/Write circuits are well-known in the art and no further discussion thereof is deemed necessary to a full and complete understanding of applicants' invention.

For the selection of a row of cells, the word lines are energized by means of an address decoder the input of which is supplied with the binary addresses of the lines to be selected.

Such a decoder 12 has as many outputs 13 as there are word lines in the memory; these outputs are designated by 13-1, 13-2 and 13-i.

Therefore, when the ith row of cells is to be selected, the corresponding address signals are applied to decoder 12 which produces a high level signal on line 13-i.

The address decoder outputs are connected to word lines WL1, WL2 and WLi through the power-supply system in accordance with the invention.

The power-supply system 14 is divided into elementary circuits 14-1, 14-2, 14-i, etc., each corresponding to a word line; the decoder output 13-i, for instance, is connected to line WLi, through circuit 14-i.

Each elementary circuit 14-i is comprised of a first transistor 15-i and a second transistor 16-i. These transistors are arranged as a current switch, i.e., their emitters are connected to each other. The base of transistor 15-i is connected to the output line 13-i of the decoder and its collector is connected to V1, ground. The base of transistor 16-i is connected to a reference voltage the value of which is within the high and low levels which appear on the line 13-i. The collector of transistor 16-1 is connected to a voltage source $-V2$ the magnitude of which is between ground (V1) and $-V3$. $-V2$ is equal to $-1.50$ volts when voltage $-V3$ is equal to $-4.25$ volts.

The operation of the power-supply system is as follows. When the output 13-i of the decoder is energized in order to select the word line WLi, the level is high on the base of transistor 15-i which is turned ON, thereby causing transistor 16-i to be OFF. The cells of the so-selected row are fed between ground and $-V3$ which is equal to $-4.25$ volts, in the chosen example.

On the other hand, in the other deselected rows, in the second row, for instance, the level on line 13-2 is low, thereby causing transistor 15-2 to be turned OFF, and transistor 16-2 is ON. Therefore, the deselected cells in the memory are fed with a voltage of 2.75 volts $(4.25-1.50)$ instead of with the 4.25 volts in the selected cells. However, the current is the same for the selected and non-selected cells since transistors 15 and 16 are current switch-connected and supply the same currents when they are ON. These currents are determined by the differential voltage at the terminals of resistor Ri. The potential at node 4 is the potential on line WLi to about the voltage Vbe (Vbe being the base-emitter voltage of a transistor) which potential is the base potential of the conducting transistor T15i or T16i, according as line WLi is selected or not. Reference voltage VREF can be chosen so as to be very near the high level at node 13.

A constant current source can also be utilized instead of resistor Ri, which is, for instance, comprised of the collector current of a transistor the emitter of which is connected to $-V3$, via a resistor, its base being brought to a fixed potential with respect to $-V3$.

In most cases, what is of interest is the total power dissipated both in the memory cells and in the power supply system in accordance with the invention. This power, which results from the current consumed by the total voltage in use, is reduced, since all the deselected cells and the associated transistors T16 are fed with a smaller total voltage.

However, the features of the cells, whether selected or not, remain the same and, more specially, the cells have the same noise immunity.

PREFERRED EMBODIMENT OF THE INVENTION

Figure 2:
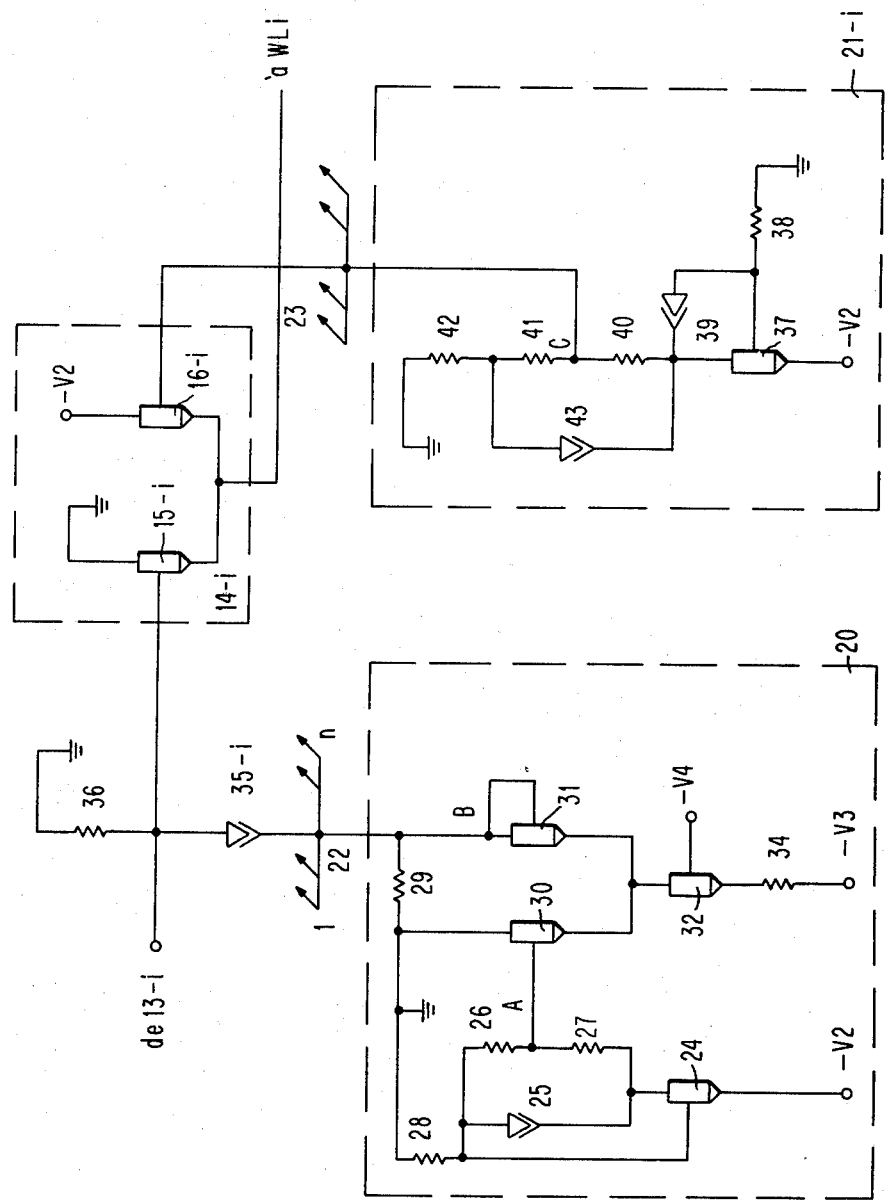
FIG. 2 illustrates two circuits for setting the voltage levels on the deselected word lines and on the selected line.

With reference to FIG. 2, another embodiment of this invention will be disclosed wherein the word lines are always fed through current switches, and which is comprised of circuits for setting the high and low levels on these lines to values which further improve the features of the cells, such as, for instance, the reading and writing rates.

In FIG. 2, there are shown element 14-i of circuit 14 as well as circuit 20 for setting the high level on the selected word line and circuit 21-i for setting the low levels on the deselected lines. Since circuit 20 is ON only when a line is selected and that there is only one line selected at a time, there is only one circuit 20 for the whole n-line memory; this is schematically shown by the arrows 22 in the figure.

In order to set the level on the deselected lines, it is necessary to provide several circuits for feeding the bases of transistors 16-i through 16-n since there is always at least n-1 of the transistors 16 that are conducting. Therefore, circuit 21 (identical with the illustrated circuit 21-i) is provided for feeding four current switch elements of circuit 14. This is schematically shown in the drawing by arrows 23 at the output of circuit 21-i. It is obvious that this results from a compromise and that a different number of circuits 21 can be envisaged. More specifically, if sufficient current can flow through circuit 21 so as to feed all transistors 16 of the n current switches, only one circuit 21 can be used.

As disclosed in the U.S. Pat. No. 3,423,737, in order that information can be read from or written into a Harper cell such as shown in FIG. 1B, a current should flow through either one of emitters EIL and E2R of one of transistors 1 and 2 contrary to what happens for the deselected cells.

The selection is carried out by increasing the potential on terminal 7 of the selected cell connected to the word line.

In order to carry out the reading operation as quickly as possible, the voltage swing on the word line must not be too large. However, in order to write a selected word, the potential at node 7 of a deselected cell must not be lower than the lower potential at nodes 5 or 6 of a selected cell.

Circuits 20 and 21 function to fulfill these conditions.

In circuit 20, transistors 24, Schottky diode 25 and resistors 26 and 27 set the potential at point A. Transistor 24 has its emitter connected to voltage-V2, its base is connected to the anode of diode 25 and its collector is connected to the other terminal of the diode. Two resistors 26 and 27 are series connected in parallel with diode 25. The anode of diode 25 is connected to ground, through resistor 28. This circuit sets the potential at point A which is taken at the common point of resistors 26 and 27.

From the potential at point A, the potential on the word line is set by transistors 30, 31, 32 and resistors 29 and 34. Point A is connected to the base of transistor 30. Transistors 30 and 31 have their emitters connected to each other and to the collector of transistor 32. Transistor 32 is a current-supply the emitter of which is connected to voltage $-V3$, through resistor 34, its base being connected to a bias voltage $-V4$ higher than $-V3$. The collector of transistor 30 is connected to ground. Transistor 31 is diode-connected, its base and its collector are connected to each other and connected to ground, through resistor 29. The collector of transistor 31 is connected to the outputs 13-1 through 13-n of the decoder through Schottky diodes 35; diode 35-i associated with output 13-i is shown in the drawing, FIG. 2.

As shown in the figure, circuit 20 supplies a voltage VA to point B, which is taken from the collector of transistor 31 and which is equal in absolute value, to:

$$-V2+VBE\ (24)-0.45\ VF\ (25)$$

VBE is representative of the base-emitter voltage of a transistor, VBE (24), being representative the base-emitter voltage of transistor 24,
VF is representative of the voltage of a Schottky diode, VF (25) being representative of the voltage of diode 25.

Factor 0.45 is given by the ratio of resistors 26 and 27, $R(26)/R(26+27)$.

Voltage VA at point A is reproduced at point B since the current of transistor 32 flows through transistors 30 and 31.

When the ith word line is selected, diode 35-i is conducting, the current in this diode is low with respect to the current in resistor 29 so that the current changes in diode 35-i caused mainly by the changes in factor $\beta$ of transistor 15-i, do not modify the potential at point B.

Therefore, the potential on the selected word line WLi is equal in absolute value, to $$V(WLi\ selected) = -V2+VBE\ (24)-0.45\ VF\ (25)+VF\ (35\text{-}i)-VBE\ (15\text{-}i) \approx -V2+0.55\ VF$$

Circuits 21, which supply the voltage to the bases of transistors 16, are similar to circuit 21-i shown in FIG. 2. This circuit sets the level at node C, through means similar to those involved for circuit 20. These means are comprised of transistor 37 the emitter of which is connected to voltage $-V2$, its base being connected to ground, through resistor 38, on the one hand, and to its collector, through a Schottky diode 39 on the other hand. The point common to the collector of transistor 37 and to the cathode of diode 39 is connected to ground, through three resistors 40, 41, 42 which are series-connected. Resistors 40 and 41 are shunted by Schottky diode 43. The anode of Schottky diode 43 is connected to the common point of resistors 42 and 41, its cathode being connected to the collector of transistor 37. The common point of resistors 41 and 42 is designated by C. This point C is connected to the bases of the four transistors 16.

Voltage VC at node C is equal, in absolute value to $$VC = -V2 + VBE(37) - VF(39) + 0.45\ VF(43)$$
$$= -V2 + VBE(37) - 0.55VF$$

Consequently, the potential on the ith word line, when deselected, because transistor 16-i is ON, is equal to $$V(WLi\ \text{deselected}) = -V2 + VBE(37) - 0.55VF - VBE\ (16\text{-}i)$$
$$= -V2 - 0.55\ VF$$

The difference between the voltages on the deselected word lines and the selected word line, therefore, is equal to 1.10 VF, which is a correct value.

It should be noted that this voltage difference can easily be adjusted by modifying the values of resistors 26, 27 and 40, 41 of the two dividing points.

While we have illustrated and described the preferred embodiments of our invention, it is to be understood that we do not limit ourselves to the precise constructions herein disclosed and the right is reserved to all changes and modifications coming within the scope of the invention as defined in the appended claim.

Having thus described our invention, what we claim as new, and desire to secure by Letters Patent is:

1. In a monolithic memory having n word lines and an address decoder having n outputs, said monolithic memory being characterized by an improved bilevel powering system, said powering system including:
   n discrete current switch circuit means;
   each of said n current switch circuit means having an input and an output;
   each of said n current switch circuit means having its input connected to a predetermined one of said n outputs of said address decoder and its output connected to a discrete one of said n word lines; and each said current switch circuit means including, a first transistor having an emitter, base and collector and a second transistor having an emitter, base and collector, said base of said first transistor being connected to said input of said current switch circuit means, said collector of said first transistor being connected to a source of potential having a magnitude $|V1|$, said base of said second transistor being connected to a reference potential, said collector of said second transistor being connected to a source of potential having at magnitude of $|V2|$, where $|V1|<|V2|$, and said emitters of said first and second transistors being connected in common to the output of said current switch means.

2. In a monolithic memory, said monolithic memory including an array of memory cells, said array having n columns and m rows of memory cells;

n pairs of bit lines, each pair of said n pairs of bit lines being connected to a discrete one of said n columns of memory cells;

m pairs of word lines, each pair of said m pairs of word lines including a first wordline and a second wordline;

each of said m rows of memory cells being connected between the first wordline and the second wordline of a discrete pair of said m pairs of wordlines;

address decoder means having a multi-bit address input and m discrete outputs;

m current switch circuit means, each of said m current switch circuit means being connected between a discrete one of said m outputs of said decoder means and the first wordline of a discrete one of said m pairs of wordlines;

each of said second wordlines being connected via circuit means to a potential source $|V3|$.

3. In a monolithic memory as claimed in claim 2 wherein each of said current switch circuit means includes:

a first transistor having an emitter, base and collector and a second transistor having an emitter, base and collector;

said base of said first transistor being connected to a discrete one of m outputs of said decoder means;

said collector of said first transistor being connected to a potential source $|V1|$;

said base of said second transistor being connected to a reference potential;

said collector of said second transistor being connected to a potential source $|V2|$, where $|V1|<|V2|<|V3|$;

and said emitters of said first and second transistors being connected in common to the second wordline of a discrete one of said m pairs of wordlines.

* * * * *